United States Patent [19]

Yahata et al.

[11] 4,145,663

[45] Mar. 20, 1979

[54] DIGITAL SYNCHRONOUS DETECTORS USING TIME DIVISION FOR EXTRACTING CARRIER WAVE AND DEMODULATED SIGNALS

[75] Inventors: Haruki Yahata; Shunsuke Honda, both of Yokohama; Tadamichi Kawasaki, Kawasaki, all of Japan

[73] Assignee: Tokyo Shibaura Electric Co., Ltd., Kawasaki, Japan

[21] Appl. No.: 870,099

[22] Filed: Jan. 17, 1978

[30] Foreign Application Priority Data

Jan. 18, 1977 [JP] Japan .................................. 52-3609

[51] Int. Cl.² .......................... H03D 1/00; H03D 3/20
[52] U.S. Cl. ....................................... 329/50; 325/346; 325/349; 325/423; 329/122; 329/136; 329/178
[58] Field of Search ................. 329/50, 122, 124, 125, 329/136, 178; 325/346, 349, 418, 419, 423

[56] References Cited

U.S. PATENT DOCUMENTS

| | | | |
|---|---|---|---|
| 3,603,890 | 9/1971 | Camenzind et al. | 329/122 X |
| 3,768,030 | 10/1973 | Brown et al. | 329/122 X |

*Primary Examiner*—Siegfried H. Grimm

*Attorney, Agent, or Firm*—Oblon, Fisher, Spivak, McClelland & Maier

[57] ABSTRACT

The detector is provided with an input control circuit supplied with a first input for extracting a carrier wave from a modulated wave and a second input for demodulating the modulated wave and controlled to produce the first and second inputs on the time division basis, a reference wave generating circuit which produces a sine wave or a cosine wave as a reference wave and produces amplitude values corresponding to designated phases, and a time division multiplying circuit which multiplies the outputs of the input control circuit with the amplitude values on the time division basis for producing the demodulated signal. There are further provided circuit means for deriving out a variable control quantity from the output of the multiplying circuit and a phase designating circuit including an adder for adding together a phase designating value at a preceding sampling time, a constant signal value and the variable control quantity at each sampling time of the modulated wave, and a memory for storing the result of addition as a new phase designating value which is applied to the reference wave generating circuit.

6 Claims, 21 Drawing Figures

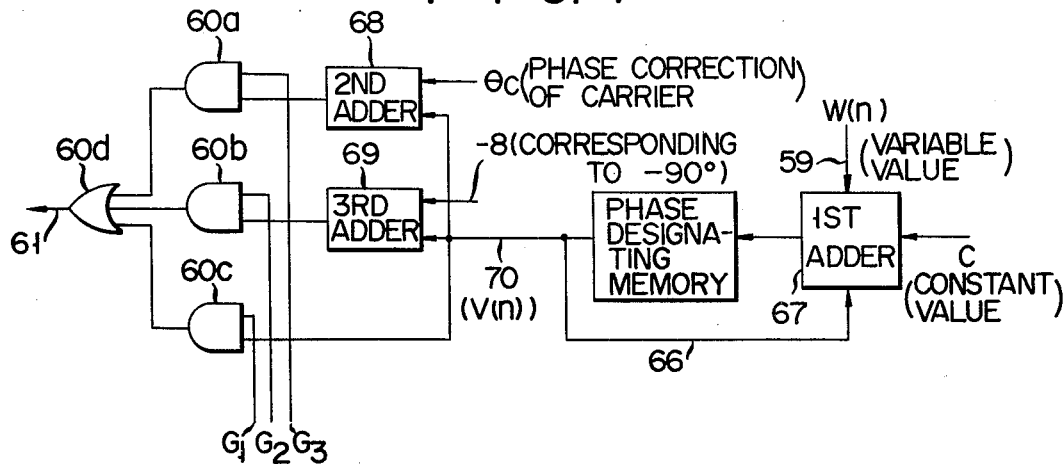
FIG. 7
FIG. 8A INPUT 1 AND 2
FIG. 8B G₁: OUTPUT OF INPUT 1
FIG. 8C G₂: OUTPUT OF INPUT 1
FIG. 8D G₃: OUTPUT OF INPUT 2
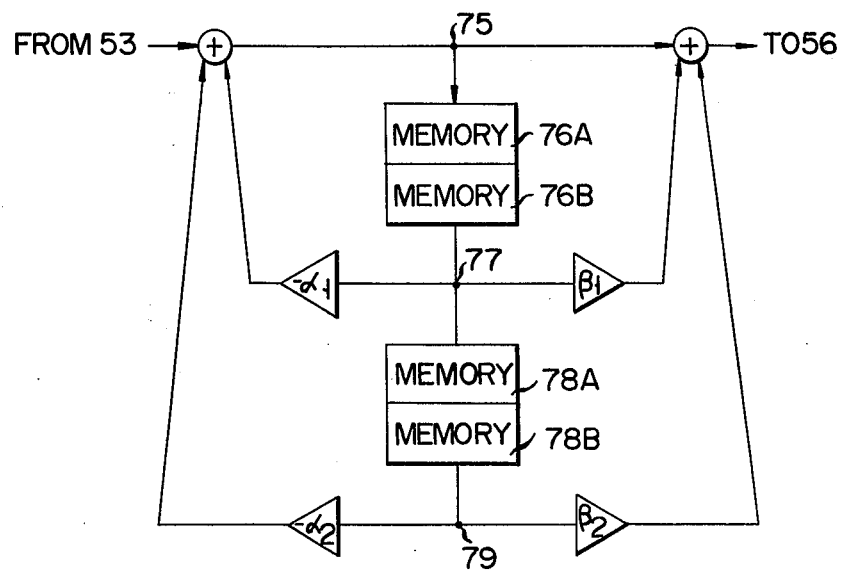
FIG. 9

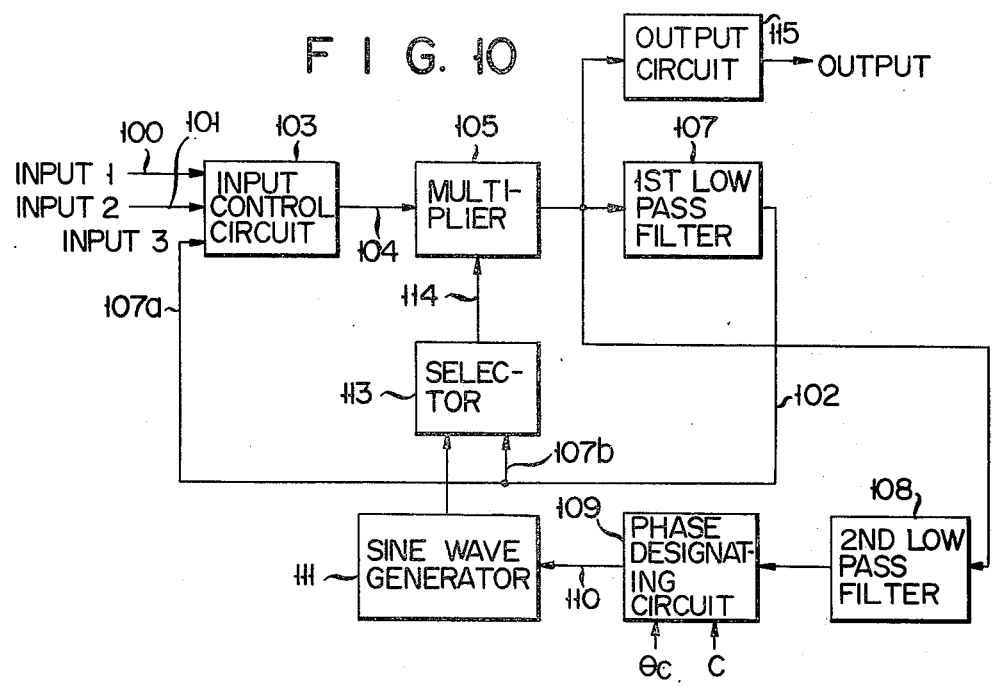
FIG. 10
FIG. 11A  INPUT 1 AND 2
FIG. 11B  INPUT1 G₁
FIG. 11C  INPUT1 G₂
FIG. 11D  INPUT2 G₃
FIG. 11E  INPUT3 G₄
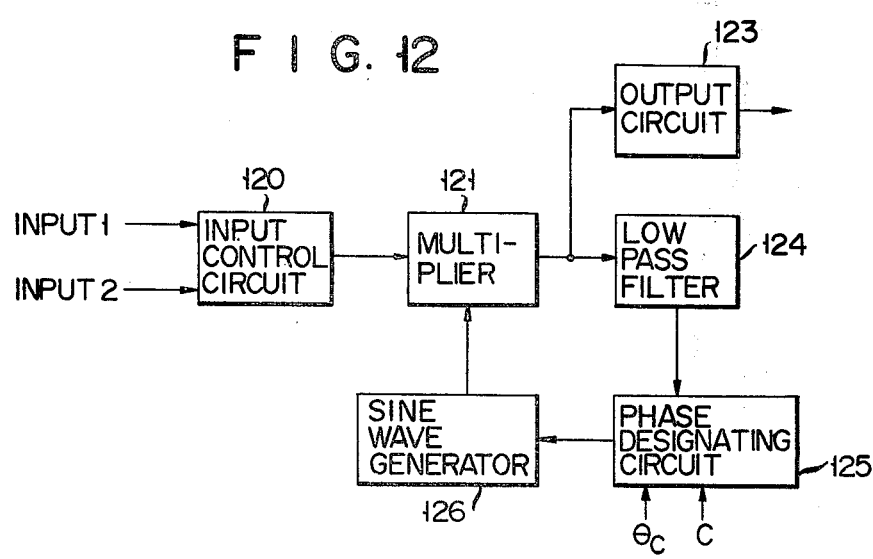
FIG. 12

DIGITAL SYNCHRONOUS DETECTORS USING TIME DIVISION FOR EXTRACTING CARRIER WAVE AND DEMODULATED SIGNALS

BACKGROUND OF THE INVENTION

This invention relates to a digital synchronous detector for digitally and synchronously detecting an amplitude modulated or a phase modulated wave.

With recent development of digital art it has become possible to construct a modulator and a demodulator which have been constructed with analogue circuits with digital large scale integrated circuits (LSI).

To have better understanding of this invention some examples of the prior art circuit will firstly be described with reference to FIGS. 1 and 2. FIG. 1 shows the construction of a digital phase lock loop in which input 10 comprises a signal train $x(n)$ sampled from a modulated wave, whereas an output 19 comprises a signal train $y(n)$ sampled from a sinusoidal wave. A multiplying circuit 11 is provided to act as a phase comparator for comparing the phases of the input 10 and the output 19. Denoting a sampling interval by T and the signal trains $x(n)$ and $y(n)$ by the following equations $$x(n) = \sin(\omega c n T + \theta)$$

$$y(n) = \cos(\omega c n T)$$

then the signal train $Z(n)$ of the output 12 from the multiplier 11 would be expressed by the following equation (1)

$$Z(n) = x(n) \cdot y(n) = \sin(\omega c n T + \theta) \cos(\omega c n T) = \tfrac{1}{2}\{\sin(2\omega c n T + \theta) + \sin\theta\} \quad (1)$$

where $\omega c$ represents a carrier wave frequency.

A digital low pass filter 13 is used to decrease a frequency component having a frequency twice the frequency of the carrier wave and to determine the characteristics of the loop. The filter 13 may have a characteristic shown by an equation $$H(Z) = K_2/(1 - K_1 Z^{-1})$$

where $H(Z)$ represents the transfer function and $K_1$ and $K_2$ represents constants. The output 14 or $W(n)$ of such filter, however, contains a relatively large amount of a component $2\omega c$. A digital voltage control oscillator VCO is constituted by an adder 15, a phase designation memory device 16 and a sine wave generator 18. The sine wave generator 18 sends fourth an amplitude value corresponding to a phase 17 designated by the phase designation memory 16. It is now assumed that the 360° phase of the sine wave is equally divided into 32 sections. Then, when the phase designation memory 16 designates a phase "15", the sine wave generator 18 would produce an output 19 having an amplitude $\cos(360°33\ 15/32)$ corresponding to a phase $360 \times 15/32$. The phase designation signal 17 or $V(n)$ produced by the phase designation memory 16 is expressed by the following equation $$V(n) = V(n-1) + C + W(n-1)$$

where C is a designation value of the center frequency of the output of the voltage control oscillator, and $W(n-1)$ is the control signal of the voltage control oscillator. For example, where the control signal $W(n-1)$ is always zero, the phase designation signal $V(n)$ will increase by C at each sampling period T so that the center frequency Fo of the output of the volage control oscillator would be expressed by the following equation $$Fo = (C/32) \cdot (1/T)$$

Where the control voltage $W(n)$ of the voltage control oscillator is positive, the phase advances rapidly so that the oscillation frequency of the voltage control oscillator becomes higher. On the contrary, where the control voltage $W(n)$ is negative, the oscillation frequency becomes lower. In equation (1), if $\theta > 0$, as the DC component $\tfrac{1}{2}\sin\theta$ is emphasized by the low pass filter 13, the control signal $W(n-1)$ of the voltage control oscillator becomes positive so that its output $V(n)$ or phase designation signal is controlled to advance the phase to be designated. On the contrary, if $\theta < 0$, the $V(n)$ is controlled to lag the phase to be designated.

Among the loops which extract the carrier component from double side band (DBS) waves is included a so-called Costas loop. FIG. 2 shows the block diagram of the Costas loop in which the input 20 has a double side band wave expressed by $$A(t)\cos(\omega ct + \theta)$$

Where the output 30 of the voltage control oscillator 29 is expressed by $\sin(\omega ct)$, the output 22A of a phase comparator 21A is expressed by the following equation:

$$lA(t) = A(t)\cos(\omega ct + \theta)\sin \omega ct$$
$$= \tfrac{1}{2}A(t)\{-\sin\theta + \sin(2\omega ct + \omega)\} \quad (2)$$

The output 30 of the voltage control oscillator passes through a 90° phase shifter 31 to produce an output 32 expressed by $-\cos(\omega ct)$. The output 22B expressed by $eB(t)$ from a phase comparator 21B which compares the output 32 with the input 20 is expressed by the following equation (3):

$$eB(t) = A(t)\cos(\omega ct + \theta)\cos(\omega ct)$$
$$\tfrac{1}{2}A(t)\{\cos\theta + \cos(2\omega ct + \theta\} \quad (3)$$

Low pass filters 23A and 23B are provided for eliminating a modulated component produced by a frequency $2\omega c$ which is equal to twice the carrier frequency $\omega c$, and the output $hA(t)$ and $hB(t)$ of these filters are expressed by the following equations, respectively:

$$hA(t) = -\tfrac{1}{2}A(t)\sin\theta$$

$$hB(t) = -\tfrac{1}{2}A(t)\cos\theta.$$

The output 26 or $g(t)$ of a multipying circuit 25 is shown by the equation (4):

$$g(t) = hA(t)\cdot hB(t) = \tfrac{1}{4}A(t)^2\sin\theta\cos\theta = \tfrac{1}{8}A(t)^2\cdot\sin 2\theta. \quad (4)$$

Since $A(t)^2 \geq 0$, it is possible to obtain a control signal 28 of the voltage control oscillator 29 having a value proportional to $\sin 2\theta$ by passing the output 26 through the low pass filter 27. For this reason, it is possible to lock the output 30 of the voltage control oscillator 29 with the input 20 by a phase comparator 21A. The Costas loop has an ambiguity of 180° in its locking phase. Of course, it is possible to construct the Costas loop as a digital type as the phase lock loop shown in FIG. 1. In a synchronous detector, it is possible to derive out a demodulated signal by multiplying in a multiplier a modulated input signal with a carrier wave which is obtained by extracting from the modulated input signal and then phase-shifting the extracted carrier wave by a proper angle, and then passing the output of the multiplier through a low pass filter which passes only the base band component.

It is an object of this invention to provide an improved digital synchronous detector having more simple construction than prior art detectors.

SUMMARY OF THE INVENTION

According to this invention, there is provided a digital synchronous detector comprising an input control circuit connected to receive a first input for extracting a carrier wave from a modulated wave and a second input for demodulating the modulated wave, and controlled to produce the first and second inputs on the time division basis; a reference wave generating circuit for generating a sine wave as a reference wave, the reference wave generating circuit producing first and second amplitude values corresponding to first and second phases of the reference wave; a time division multipying circuit coupled to the input control circuit and the reference signal generating circuit for effecting multiplying operations on the time division basis during first and second intervals, the multiplying circuit multiplying the first input with the first amplitude value corresponding to the first phase during the first interval, and multipying the second input with the second amplitude value corresponding to the second phase which is shifted a predetermined angle from the first phase during the second interval; an output circuit for deriving out a demodulated signal from the output of the multiplying circuit during the second interval; means for deriving out a variable control quantity from the output of the multiplying circuit; and a phase designating circuit coupled to the variable control quantity deriving out means and the reference wave generating circuit for designating the first and second phases of the reference wave, the phase designating circuit including means for adding a definite value and the variable control quantity to a phase designation value obtained at a preceding sampling time at each sampling time of the modulated wave and memory means for storing the result of the addition as a new phase designating value so as to give the stored result to the reference wave generating circuit.

BRIEF DESCRIPTION OF THE DRAWINGS

FIG. 7 is a connection diagram showing the detail of the phase designating circuit shown in FIG. 5;

FIGS. 8A through 8D show a timing diagram of the inputs and outputs of the input control circuit shown in FIG. 5;

FIG. 9 is a connection diagram showing the detail of the first low pass filter shown in FIG. 5;

FIG. 10 is a block diagram showing another embodiment of this invention;

FIGS. 11A through 11E show a timing diagram of inputs and outputs of the input control circuit shown in FIG. 10; and FIG. 12 is a block diagram showing still another embodiment of this invention.

DESCRIPTION OF THE PREFERRED EMBODIMENTS

Figure 1:
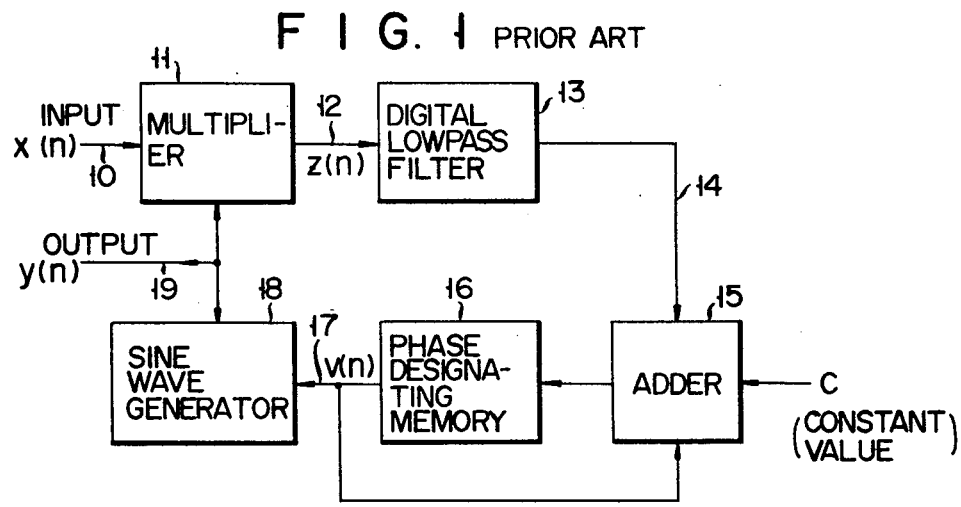
FIG. 1 is a block diagram showing a prior art digital phase lock loop.
Figure 2:
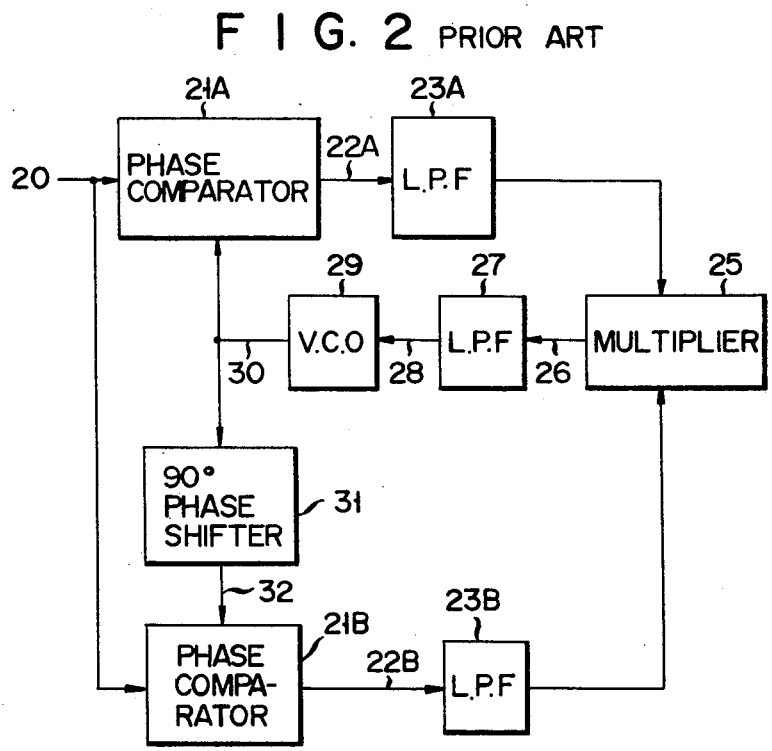
FIG. 2 is a block diagram showing a prior art Costas loop.
Figure 3:
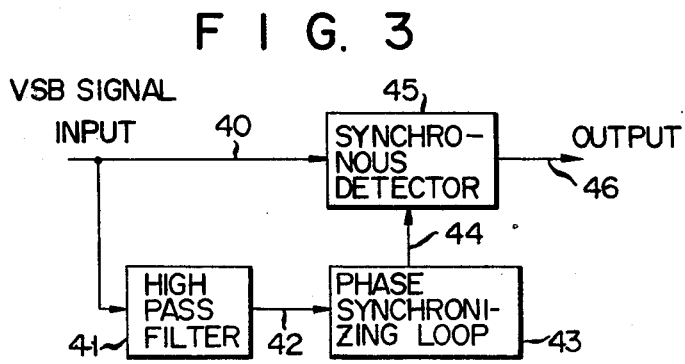
FIG. 3 is a block diagram showing a vestigial side band (VSB) synchronous detector.
Figure 4A:
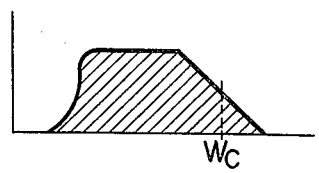
FIGS. 4A, 4B and 4C show frequency spectra at various portions of the circuit shown in FIG. 3.
Figure 4B:
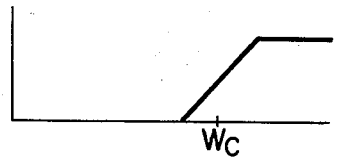
Figure 4C:
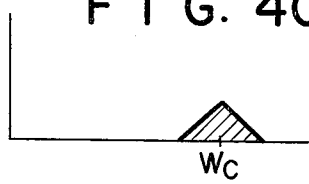
Figure 5:
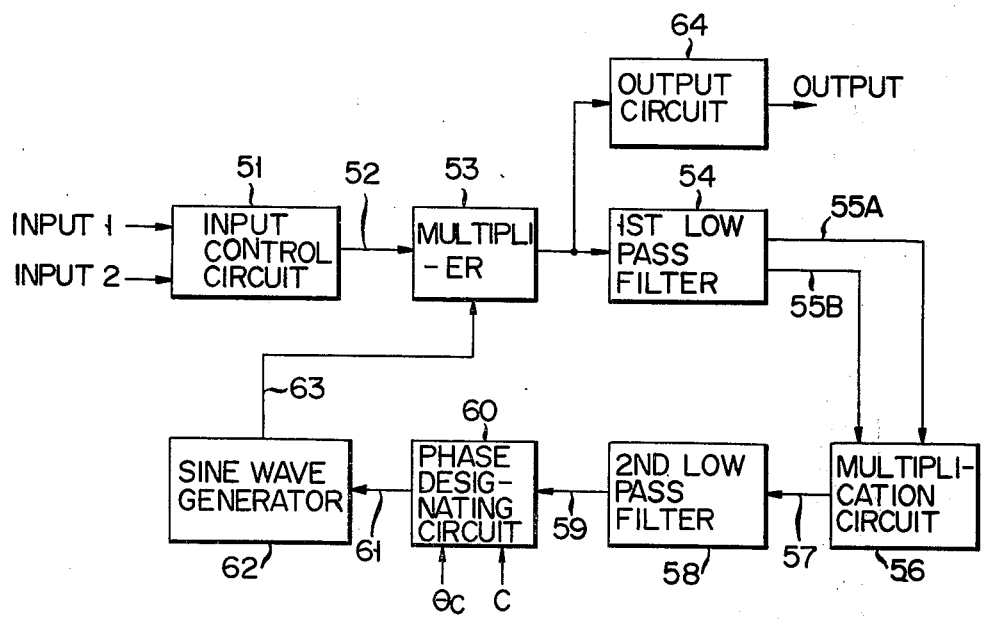
FIG. 5 is a block diagram showing one embodiment of this invention.

FIG. 5 shows a digital synchronous detector utilizing a Costas loop. In the synchronous detector utilizing a Costas loop, in a multiplier which multiplies the input with the output of a voltage control oscillator, the following three multiplying operations are performed for the purpose of effecting phase comparison and synchronous detection:

a first multiplying operation:
  input for extracting carrier wave x $\sin(\omega nT)$
a second multiplying operation:
  input for extracting carrier wave x $\{-\cos(\omega nT)\}$
a third multiplying operation:
  input for demodulating modulated wave x $\sin(\omega nT - \theta c)$ The input for extracting the carrier wave is not always equal to the input for effecting demodulation, but where the modulated wave comprises a double side band signal these two inputs may be the same. However, in the case of a vestigial side band signal, since the upper and lower side band waves of the VSB signal utilized to extract the carrier wave are not symmetrical it is necessary to use a filter to shape the upper and lower side band wave to be symmetrical. For example, where the input signal 40 to the synchronous detector 45 shown in FIG. 3 comprises a vestigial side band signal the frequency spectrum thereof is shown by FIG. 4A. When a signal shown in FIG. 4A is passed through a high pass filter 41 having a frequency characteristic as shown in FIG. 4B it is possible to obtain an output 42 having a spectrum as shown in FIG. 4C in which the upper and lower side band waves are symmetrical. This output 42 is applied to a Costas phase synchronizing loop 43 to extract the carrier wave, and the output 44 of the Costas phase synchronizing loop 43 is applied to synchronous detector 45 for synchronously detecting the input signal 40. In this case, however, since the phase of the input signal is varied in a high pass filter 41 it is necessary to shift the phase of the carrier wave by a definite angle $\theta c$ by using the phase synchronizing loop 43.

Figure 6:
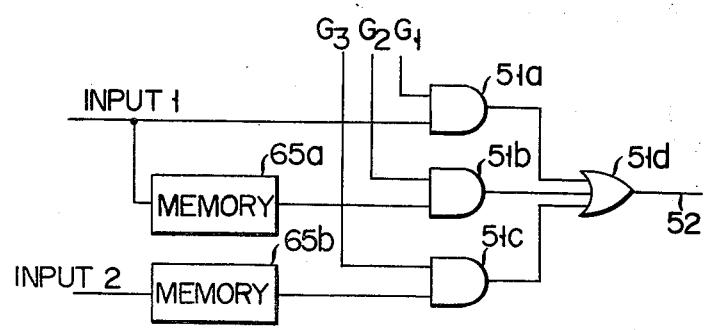
FIG. 6 is a connection diagram showing the detail of the input control circuit shown in FIG. 5.

One embodiment of this invention shown in FIG. 5 which is constructed to eliminate the defect just described will be explained. In FIG. 5, the first input 1 for extracting the carrier wave and the second input for effecting demodulation are applied to the same input control circuit 51. As shown in FIG. 5, the input control circuit 51 is constructed such that it supplies the first and second inputs to a multiplying circuit 53 at a predetermined timing as an output 52 as shown in FIG. 6. The timings of the control signals $G_1$, $G_2$ and $G_3$ applied to AND gate circuits 51a, 51b and 51c shown in FIG. 6 and the timing of both inputs 1 and 2 are shown in FIGS. 8A through 8D. As shown in FIG. 6 the first input 1 is applied to one input of the first AND gate circuit 51a and to one input of the second AND gate circuit 51b through a memory 65a while the second input 2 is applied to one input of the third AND gate circuit 51c through a memory 65b. To the other inputs of the first to third AND gate circuits are applied control signals $G_1$, $G_2$ and $G_3$ at a timing shown in FIGS. 8B, 8C and 8D. The input 2 is supplied at a timing shown in FIG. 8A but stored in the memory 65b to be applied to the third AND gate circuit 51c at the timing of the control signal $G_3$. The outputs of the first to third AND gate circuits are applied to the multiplier 53 via an OR gate circuit 51d. An output circuit 64 and a first low pass filter 54 are connected on the output side of the multiplier 53. The outputs of the first low pass filter 54 are applied to the other multiplier 56 and the output 57 thereof is applied to a second low pass filter 58 which supplies a necessary component 59 to a phase designating circuit 60 as a variable control quantity.

As shown in detail in FIG. 7, the phase designating circuit 60 comprises a phase designating memory 66; a first adder 67 which adds the output 59 of the second low pass filter 58 to a constant value C to be described later and to the output 70 of the phase designating memory 66 and supplies its output to the phase designating memory 66; a second adder 68 which is connected to receive the output 70 of the phase designating memory 66; an AND gate circuit 60a having one input connected to receive the output of the second adder 68; a third adder 69 supplied with the output 70 of the phase designating memory 66; an AND gate circuit 60b having one input connected to receive the output of the third adder 69; an AND gate circuit 60c having one input connected to receive the output 70; and an OR gate circuit 60d connected to receive the outputs of the AND gate circuits 60a, 60b and 60c and applies its output 61 to a reference wave (sine wave) generator 62. The other inputs of the AND gate circuits 60a, 60b and 60c are respectively supplied with control signals $G_1$, $G_2$ and $G_3$ having timings as shown in FIGS. 8B, 8C and 8D. The relationship between a signal train V(n) of the output 70 of the phase designating memory 66 and a signal train W(n) of the output 59 of the second low pass filter 58 is expressed by the following equation:

$$V(n) = V(n-1) + C + W(n-1)$$

where, as described before, C represents a constant value for determining the center frequency of the output of the voltage control oscillator and W(n) represents a variable control quantity for controlling the voltage control oscillator. The first adder 67 repeates an operation of returning to zero when its count reaches a value corresponding to 360°. Thus, where the value corresponding to 360° is equal to 32, the adder 67 conducts adding operation according to mod 32. The phase designating signal 61 applied to the sine wave generator 62 is equal to the output V(n) of the phase designating memory 66 at the timing of the control signal $G_1$ and supplied to the sine wave generator 62 to derive therefrom the amplitude value of the sine wave corresponding to the designated phase. The amplitude value is supplied to the multiplier 53. The multiplying operation effected at the timing of the control signal $G_1$ corresponds to the first multipying operation described before. The third adder 69 adds V(n) − 8 according to mod 32. Assuming now that 32 represents an angle of 360°, −8 corresponds to a phase of −90° and the result of addition in the third adder is supplied to the sine wave generator 62 at a timing of control signal $G_2$ and the amplitude value of the sine wave at a phase corresponding to the result of addition is supplied to the multiplying circuit 53 at the same timing of the control signal $G_2$. This multiplying operation corresponds to the second multiplying operation or the equation (3) both described before. The second adder 68 conducts the addition of V(n) + θc according to mod 32. As described before, θc is a factor that is added for the purpose of correcting the phase of the carrier wave for effecting synchronous detection. The result of addition in the second adder 68 is applied to the sine wave generator 62 at the timing of the control signal $G_3$ for applying an amplitude value of the sine wave corresponding to the designated phase. The amplitude value is applied to the multiplier 53 at the timing of control signal $G_3$. At this time, the multiplying circuit 53 performs the third multiplying operation described before which is necessary to effect synchronous detection.

The first low pass filter 54 is a digital filter for eliminating the component modulated by the frequency 2Wc of twice the carrier wave and for extracting the component $-\frac{1}{2}A(t) \sin \theta$ (shown by 55A) of equation (2) and the component $-\frac{1}{2}A(t) \cos \theta$ (shown by 55B) of equation (3). The filter 54 has a multiplex construction that can be used on a time division basis for the results of the first and second multiplying operations described before. FIG. 9 shows one example of the construction of the filter 54. More particularly, between points 75 and 77 and between points 77 and 79 the output signal from the multiplier 53 is delayed one sampling period. Memories 76A and 78A respectively store a signal train of the result of the first multiplying operation (equation (2)), whereas memories 76B and 78B respectively store a signal train of the result of the second multiplying operation (equation (3)). The characteristic of the digital filter shown in FIG. 9 is expressed by $$H(Z) = (1 + \beta_1 Z^{-1} + \beta_2 Z^{-2})/(1 + \alpha_1 Z^{-1} + \alpha_2 Z^{-2})$$

where $\alpha_1$, $\alpha_2$, $\beta_1$ and $\beta_2$ represent coefficients, respectively. By selecting suitable values for these coefficients it is possible to provide a low pass filter having a desired characteristic. Even when the low pass filter 54 can not perfectly cut off a component modulated by a frequency of 2Wc which is twice the carrier wave, extraction of the carrier wave is possible. In an extreme case, extraction of the carrier wave is possible even when the low pass filter 54 is omitted.

The output circuit 64 is constructed to store the result of the third multiplying operation mentioned before which is performed for the purpose of performing synchronous detection and to produce the stored result as a suitable timing. Since the result of multiplying operation contains a modulated component by a frequency of 2Wc, it is necessary to use an additional low pass filter, not shown, in order to eliminate this modulated component from the output of the output circuit 64. Where the first low pass filter 54 has a cutoff characteristic that can completely eliminate the modulated component by 2Wc the low pass filter 54 can be constructed as a three system time division multiplex construction which operates on the time division basis for the inputs of three systems so as to derive out the detected output from the filter 54. At this time, a demodulated base band component is obtained as the detected output.

The low pass filter 54 produces a signal train representing the result of the first multiplying operation (equation (2)) at the timing of control signal $G_1$ and a signal train representing the result of the second multiplying operation (equation (3)) at the timing of control signal $G_2$. Although in FIG. 5, two output lines 55A and 55B are shown, actually only one output line is sufficient because the outputs are produced on the time division basis. The multiplying circuit 56 multiplies these two outputs. More particularly, it stores temporarily the first input supplied thereto over line 55A at the timing of the control signal $G_1$ and then multiplies the first input with the second input supplied thereto over line 55B at the timing of the control signal $G_2$. The output of the multiplier 56 is g(t) expressed by equation (4).

As above described, in the embodiment shown in FIG. 5, first and second inputs 1 and 2 are applied. In the first period, that is at the timing of the control signal $G_1$, the amplitude value of the sine wave corresponding to the first phase designated by the digital voltage control oscillator is multiplied by the first input 1, while in the second period, that is at the timing of the control signal $G_2$, the amplitude value of a sine wave corresponding to the second phase which is shifted 90° in a predetermined direction from the first designated phase is multiplied with input 1. In the third period, that is at the timing of the control signal $G_3$, the amplitude value of a sine wave corresponding to a third phase which is phase-shifted by a definite angle $\theta c$ which is set from outside from the first phase is multiplied by the second input 2. The sine wave generator 62 and the multiplier 53 are operated on the time division basis. Accordingly it is possible to provide a digital synchronous detector having a simple circuit construction.

In the modified embodiment of this invention shown in FIG. 10, a single multiplier 105 is provided so as to operate the multipliers 53 and 56 shown in FIG. 5 on the time division basis. Three inputs 1, 2 and 3 are applied to an input control circuit 103 at the timings shown in FIGS. 11A through 11E. The input 1 is supplied to multiplier 105 at the timing of control signal $G_1$, and at the timing of control signal $G_2$ after it has been temporarily stored in a memory. In the same manner, input 2 is also temporarily stored in another memory and then applied to the multiplier 105 at the timing of the control signal $G_3$. The third input 3 is also temporarily stored in still another memory and then applied to the multiplier 105 at the timing of the control signal $G_4$. The outputs 114 of a sine wave generator 111 are supplied to the multiplier 105 through a selector 113 at the timings of control signals $G_1$, $G_2$ and $G_3$, respectively. At this time, the phase designating circuit signal 110 produced by a phase designating circuit 109 designates a first phase at the timing of control signal $G_1$, designates a second phase which is 90° shifted from the first phase at the timing of the control signal $G_2$, and designates a third phase which is shifted a definite angle $\theta c$ from the first phase at the timing of control signal $G_3$. The multiplier 105 multiplies with each other, on the time division basis, two inputs applied with the same timing, that is at the timing of control signal $G_1$, the input 1 with the amplitude value of the first phase, at the timing of the control signal $G_2$, input 1 with the amplitude value of the second phase, and at the timing of control signal $G_3$, input 2 with the amplitude value of the third phase. The results of the multiplying operations performed at the timings of control signals $G_1$ and $G_2$ are applied to the first low pass filter 107. The result of the multiplying operation performed at the timing of control signal $G_3$ is applied to the output circuit 115. The first low pass filter 107 produces an output 107a at the timing of control signal $G_1$ and another output 107b at the timing of control signal $G_2$. The output 107b is applied to the selector 113 to be temporarily stored in a memory device and then applied to the multiplier 105 at the timing of control signal $G_4$. The other output 107a is applied to the input control circuit 103 at the timing of control signal $G_1$ to be temporarily stored in a memory and then applied to the multiplier 105 at the timing of control signal $G_4$. Accordingly, outputs 107a and 107b are multiplied with each other at the timing of control signal $G_4$, and the result of this multiplying operation is applied to the second low pass filter 108 at the timing of control signal $G_4$. The output of the second low pass filter 108 is applied to the phase designating circuit 109 at the timing of control signal $G_4$ to act as a new control signal of the voltage control oscillator. The sine wave generator 111 supplies to the selector 113 amplitudes of a sine wave corresponding to respective phases designated by the output 110 of the phase designating circuit 109. When supplied with a definite value C and a value $\theta c$ utilized to correct the phase of the carrier wave, the phase designating circuit 109 operates in the same manner as in the previous embodiment shown in FIG. 5.

The embodiments shown in FIGS. 5 and 10 show the synchronous detectors where the invention is applied to a Costas loop. However, it will be clear that the invention is also applicable to a synchronous detector utilizing a phase lock loop, such application being shown in FIG. 12. In FIG. 12, a first input 1 for extracting the carrier wave and a second input for effecting demodulation are applied to an input control circuit in the same manner as in the synchronous detector utilizing a Costas loop. In the case of a phase lock loop, since it is necessary to perform only once the phase comparison, the multiplier 121 is required to perform two multiplying operations on the time division basis, that is the following two multiplying operations:

a first multiplying operation:
  input for extracting carrier wave x cos ($\omega nT$)
a second multiplying operation:
  input for demodulation x cos ($\omega n - \theta n$)

The multiplier 121 performs the first multiplying operation during a first period, that is at the timing of a control signal $G_1$, and controls the loop in accordance with the result of the first multiplying operation. Furthermore, the multiplier 121 performs the second multiplying operation during a second period, that is at the timing of another control signal $G_2$ and an output circuit 123 produces a demodulated output in accordance with the result of the second multiplying operation. Since the principle of operation of the digital phase loop has been described before it is not necessary to repeat it again. When the carrier wave is extracted by using the phase lock loop, it is impossible to use a carrier suppressed AM wave as the first input (possible with the Costas loop) so that it is necessary for the input 1 to contain a carrier component to some extent. Denoting a signal free from any DC component by A(t), the input 1 can be expressed by the following equation $$\{A(nT) + K\} \sin(\omega nT + \phi)$$

where K is a constant. Expressing the output of the sine wave generator during the first period $G_1$ by $\cos(\omega nT)$, the result of the first multiplying operation is expressed by $$\{A(nT) + K\} \cdot \{\sin \phi + \sin (2\omega nT)\}$$

The result of this multiplying operation shows that it is necessary to extract a component proportional to $\sin \phi$ by means of the low pass filter 124 and to apply this component to the phase designating circuit 125. Of course, it is assumed that the component expressed by $$\{A(nT) + K\} \cos (2\omega nT)$$

has been completely eliminated by the low pass filter 124. Furthermore it is necessary that the component K passing through the low pass filter 124 should be larger than the component A(nT) passing through the same low pass filter. The phase designating circuit 125 has the same construction as those of the previous embodiments.

Although in the foregoing embodiments, the reference wave generator was shown as comprising a sine wave generator, it may comprise a generator which generates a wave which is phase-shifted a definite angle from the sine wave, for example a cosine wave. However, for the sake of simplicity, all of these waves are herein termed a sine wave.

What we claim is:

1. A digital synchronous detector comprising:
   an input control circuit connected to receive a first input which is a modulated wave from which a carrier wave is to be extracted, and a second input which is said modulated wave, and controlled to produce said first and second inputs on the time division basis;
   a reference wave generating circuit for generating a sine wave as a reference wave,
   said reference wave generating circuit producing at least first and second amplitude values corresponding to first and second phases of said reference wave;
   a time division multiplying circuit coupled to said input control circuit and said reference signal generating circuit for effecting multiplying operations on the time division basis during at least first and second intervals,
   said multiplying circuit multiplying said first input with the first amplitude value corresponding to said first phase during said first interval, and multiplying said second input with said second amplitude value corresponding to said second phase which is shifted a predetermined angle from said first phase during said second interval;
   an output circuit for deriving out a demodulated signal from the output of said multiplying circuit during said second interval;
   means for deriving out a variable control quantity from the output of said multiplying circuit; and
   a phase designating circuit coupled to said variable control quantity deriving out means and said reference wave generating circuit for designating said first and second phases of said reference wave,
   said phase designating circuit including means for adding a definite value and said variable control quantity to a phase designation value obtained at a preceding sampling time at each sampling time of said modulated wave and
   memory means for storing the result of said addition as a new phase designating value so as to give said stored result to said reference wave generating circuit.

2. A digital synchronous detector comprising an input control circuit connected to receive a first input, which is a modulated wave from which a carrier wave is to be extracted, and a second input which is said modulated wave and controlled to produce said first and second inputs on the time division basis;
   a reference wave generating circuit for generating a sine wave as a reference wave,
   said reference wave generating circuit producing first and second amplitude values corresponding to first and second phases of said reference wave;
   a time division multiplying circuit coupled to said input control circuit and said reference signal generating circuit for effecting multiplying operations on the time division basis during first and second intervals,
   said multiplying circuit multiplying said first input with said first amplitude value corresponding to said first phase during said first interval, and multiplying said second input with said second amplitude value corresponding to said second phase which is shifted a predetermined angle from said first phase during said second interval; and output circuit for deriving out a demodulated signal from the output of said multiplying circuit during said second interval;
   a low pass filter for deriving out a DC component as a variable control quantity from the output of said multiplying circuit during said first interval; and
   a phase designating circuit coupled to said low pass filter and said reference wave generating circuit for designating said first and second phases of said reference wave,
   said phase designating circuit including means for adding a definite value and said variable control quantity to a phase designation value obtained at a preceding sampling time at each sampling time of said modulated wave, and
   memory means for storing the result of said addition as a new phase designating value so as to give said stored result to said reference wave generating circuit.

3. A digital synchronous detector comprising:
   an input control circuit connected to receive a first input, which is a modulated wave from which a carrier wave is to be extracted and a second input which is said modulated wave and controlled to produce said first and second inputs on the time division basis;
   a reference wave generating circuit for generating a sine wave as a reference wave,
   said reference wave generating circuit producing first, second and third amplitude values respectively corresponding to first, second and third phases of said reference wave;
   a time division multiplying circuit coupled to said input control circuit and said reference wave generating circuit for effecting multiplying operations on the time division basis during first, second and third intervals,
   said multiplying circuit multiplying said first input with said first amplitude value corresponding to said first phase during said first interval, multiplying said first input with said second amplitude value corresponding to said second phase which is shifted 90° from said first phase during said second interval, and multiplying said second input with said third amplitude value corresponding to said third phase which is shifted a predetermined angle from said first phase during said third interval;

an output circuit for deriving out a demodulated output signal from the output of said multiplying circuit during said third interval;

a first low pass filter for deriving out predetermined components from respective results of multiplying operations of said multiplying circuit during said first and second intervals;

another multiplying circuit for multiplying each other said components derived out from said low pass filter;

a second low pass filter for deriving out a variable control quantity from the output of said another multiplying circuit; and a phase designating circuit coupled with said second low pass filter and with said reference wave generating circuit for designating said first, second and third phases of said reference wave, said phase designating circuit including means for adding a definite value and said variable control quantity to a phase designating value designated at a preceding sampling time at each sampling time of said modulated wave and memory means for storing the result of said addition as a new phase designating value so as to give said stored result to said reference wave generating circuit.

4. The digital synchronous detector according to claim 3 wherein said input control circuit comprises a first AND gate circuit with one input supplied with said first input; a second AND gate circuit with one input supplied with said first input through a first memory; a third AND gate circuit with one input supplied with said second input through a second memory; an OR gate circuit having inputs connected to receive the outputs of said first, second and third AND gate circuits and an output connected to said time division multiplying circuit; means for supplying first to third timing signals having different timings to the other inputs of said first, second and third AND gate circuits.

5. The digital synchronous detector according to claim 3 wherein said phase designating circuit comprises a phase designating memory; a first adder for adding together the output of said phase designating memory, the output of said second low pass filter, and said definite value; means for supplying the result of addition of said first adder to said phase designating memory; a second adder for adding the output of said phase designating memory to a data adapted to correct the phase of said carrier wave; a third adder for adding the output of said phase designating memory and a data adapted to shift the phase of said carrier wave by 90°; a first AND gate circuit having one input connected to receive the output of said second adder; a second AND gate circuit having one input connected to receive the output of said third adder; a third AND gate circuit having one input connected to receive the output of said phase designating memory; an OR gate circuit with inputs connected to receive the outputs of said first, second and third AND gate circuits and an output connected to said reference wave generating circuit; and means for supplying control signals that designate said third, second and first intervals respectively to the other inputs of said first, second and third AND gate circuits.

6. A digital synchronous detector comprising:

an input control circuit connected to receive a first input, which is a modulated wave from which a carrier wave is to be extracted, and a second input which is said modulated wave and a third input, and controlled to produce said first input during first and second intervals, said second input during a third interval and said third input during a fourth interval;

a reference wave generating circuit for generating a sine wave as a reference wave, said reference wave generating circuit producing first, second and third amplitude values respectively corresponding to first, second and third phases respectively of said reference wave;

a time division multiplying circuit coupled to said input control circuit directly, and to said reference wave generating circuit through a selector, said multiplying circuit multiplying said first amplitude value corresponding to said first phase of said reference wave with said first input during said first interval, multiplying said first input with said second amplitude value of said reference wave corresponding to said second phase which is shifted 90° from said first phase during said second interval, multiplying said second input with said third amplitude value of said reference wave corresponding to said third phase which is shifted a predetermined angle from said first phase during said third interval, and multiplying said third input with the output of said selector during said fourth interval;

an output circuit for deriving out a demodulated output signal from the output of said time division multiplying circuit during said third interval;

a first low pass filter which derives a predetermined component out of the result of multiplication of said time division multiplying circuit effected during said first interval and applies said predetermined component to said input control circuit as said third input, said first low pass filter deriving another predetermined component out of the result of multiplication of said time division multiplying circuit effected during said second interval and applying said another predetermined component to said time division multiplying circuit through said selector during said fourth interval;

a second low pass filter for deriving a variable control quantity out of the result of multiplication effected during said fourth interval;

and a phase designating circuit coupled to said second low pass filter and said reference wave generating circuit for designating said first, second and third phases of said reference wave, said phase designating circuit including an adder for adding a definite value and the variable value of said variable control quantity to a phase designating value obtained at the time of a preceding sampling time at each time of sampling said modulated wave, a phase designating memory means for storing the result of said adding operation of said adder as a new phase designating value, and means for applying said stored value to said reference wave generating circuit.

* * * * *